United States Patent [19]

Dreifus et al.

[11] Patent Number: 5,173,761
[45] Date of Patent: Dec. 22, 1992

[54] SEMICONDUCTING POLYCRYSTALLINE DIAMOND ELECTRONIC DEVICES EMPLOYING AN INSULATING DIAMOND LAYER

[75] Inventors: David L. Dreifus, Cary; Kumar Das; Koichi Miyata, both of Raleigh, all of N.C.; Koji Kobashi, Nishinomiya, Japan

[73] Assignee: Kobe Steel USA Inc., Electronic Materials Center, Research Triangle Park, N.C.

[21] Appl. No.: 646,848

[22] Filed: Jan. 28, 1991

[51] Int. Cl.$^5$ .................. H01L 29/04; H01L 27/01; H01L 29/80; H01L 29/161
[52] U.S. Cl. ........................ 257/22; 257/51; 257/66; 257/73; 257/77; 257/288; 257/613; 257/921
[58] Field of Search ............. 357/15, 16, 22, 23.1, 357/58, 59, 60

[56] References Cited

U.S. PATENT DOCUMENTS

| | | | |
|---|---|---|---|
| 3,142,595 | 7/1964 | Wentorf, Jr. | 148/171 |
| 4,104,344 | 8/1978 | Pope et al. | 264/42 |
| 4,163,769 | 8/1979 | Pope et al. | 264/42 |
| 4,191,735 | 3/1980 | Nelson et al. | 423/446 |
| 4,571,447 | 2/1986 | Prins | 136/252 |
| 4,740,263 | 4/1988 | Imai et al. | 156/613 |
| 4,783,368 | 11/1988 | Yamamoto et al. | 428/408 |
| 4,863,529 | 9/1989 | Imai et al. | 148/33.4 |
| 4,929,489 | 5/1990 | Dreschoff et al. | 428/195 |
| 4,929,986 | 5/1990 | Yoder | 357/22 |
| 4,949,347 | 8/1990 | Satoh et al. | 372/41 |
| 5,099,296 | 3/1992 | Mort et al. | 357/4 |

FOREIGN PATENT DOCUMENTS

| | | |
|---|---|---|
| 343963 | 11/1989 | European Pat. Off. |
| 57-128047 | 8/1982 | Japan. |
| 58-60696 | 4/1983 | Japan. |
| 62108798 | 5/1984 | Japan. |
| 59-08821 | 11/1984 | Japan. |
| 59-195516 | 11/1984 | Japan. |
| 59-213126 | 12/1984 | Japan. |
| 60-246627 | 12/1985 | Japan. |
| 62-33468 | 2/1987 | Japan. |
| 62-113797 | 5/1987 | Japan. |
| 63-307196 | 12/1988 | Japan. |
| 64-55862 | 3/1989 | Japan. |
| 1-158774 | 6/1989 | Japan. |
| 1-161759 | 6/1989 | Japan. |
| 1-239091 | 9/1989 | Japan. |
| 1485364 | 9/1977 | United Kingdom. |

OTHER PUBLICATIONS

G. Amaratunga et al., "Heterojunction Diodes Formed Using Thin-Film C Containing Polycrystalline Diamond and Si", *IEEE Electron Device Letters*, vol. 11, (Jan. 1990) pp. 33-35.

(List continued on next page.)

*Primary Examiner*—J. Carroll
*Attorney, Agent, or Firm*—Oblon, Spivak, McClelland, Maier & Neustadt

[57] ABSTRACT

A method and apparatus for contructing diamond semiconductor structures made of polycrystalline diamond thin films is disclosed. The use of a polycrystalline diamond deposition on a substrate material provides an advantage that any substrate material may be used and the ability to use polycrystalline diamond as a material is brought about through the use of an undoped diamond layer acting as an insulating layer which is formed on a boron-doped layer. Because of the structure, ion implantation can be employed to reduce the ohmic contact resistance. The ion implantation also provides that the entire structure can be made using a deep implant to form a channel layer which allows the insulating gate structure to be formed as an integral part of the device. The buried channel can be doped through the use of several implantation steps through the insulating undoped layer. As a result, the process and device is able to provide active polycrystallline diamond devices which have excellent resistance and reverse voltage characteristics while having an increased temperature capacity and increased range of operational environmental conditions when contrasted with the silicon technology. Furthermore with the disclosed process and devices, there is no requirement for a single crystal diamond substrate.

16 Claims, 4 Drawing Sheets

OTHER PUBLICATIONS

G. Sh. Gildenblat et al., "Schottky Diodes with Thin Film Diamond Base", *IEDM* 88, pp. 626–629.

Japanese Journal of Appl. Phys., 28, L2153 1989, "Field-Effect Transistors using Boron-Doped Diamond Epitaxial Films", H. Shiomi et al.

2nd International Conference on New Diamond Science and Technology, Washington, DC, Sep. 1990, "Characterization of Boron-Doped Diamond Epitaxial Films and Applications for High Voltage Schottky Diodes and MESFETs".

Appl. Phys. Lett. 4, 950–2 (1982), J. F. Prins, "Bipolar Transistor Action in Ion Implanted Diamond".

Japanese Journal of Appl. Phys. 28, 758 (1989), "Electrical Characteristics of Metal Contacts to Boron-Doped Diamond Epitaxial Films", H. Shiomi et al.

SEMICONDUCTING POLYCRYSTALLINE DIAMOND ELECTRONIC DEVICES EMPLOYING AN INSULATING DIAMOND LAYER

BACKGROUND OF THE INVENTION

1. Field of the Invention

The present invention relates to the field of semiconducting diamond technology and particularly to an improved arrangement for the fabrication of electronic devices such as rectifying diodes and transistors.

2. Discussion of Background

It has been recognized that semiconductor diamond provides superior electrical, thermal, mechanical, and optical properties which can be used in a wide range of electronic and optical device applications including high temperature and high power electronics as well as devices which operate in extreme environmental conditions.

The development of diamond electronic devices such as diamond transistors include the work of Shiomi et al in the Japanese Journal of Applied Physics, Vol. 12, L2153 (1989). This work involves fabricating a transistor on a single crystal diamond, which provides relatively poor electrical characteristics. Subsequently, in a presentation at the 1990 Second International Conference on the New Diamond Science and Technology, Shiomi et al. introduced an undoped diamond layer into their structure in order to improve the gate electrode performance. A Schottky diode with an additional undoped layer exhibited a room temperature breakdown voltage of 520 volts and provided rectification up to a temperature of 300° C. The improved transistor characteristics were still considered to be too poor to be an acceptable commercial device and furthermore only room temperature operation was demonstrated. The structural design, the material properties, and device design or layout of Shiomi et al are not optimized.

One of the major impediments to construction of the Shiomi et al device is the requirement for a single crystal diamond substrate. Homoepitaxy is extremely expensive, requiring insulating natural or synthetic diamond substrates.

Heteroepitaxy of diamond has not been sufficiently demonstrated in any prior art material other than on microscopic cubic boron nitride crystals, which are small in size and equally as difficult to synthesize by high pressure/high temperature process as are synthetic single crystal diamonds.

The use of a blanket deposition of an insulating diamond layer such as the device of Shiomi et al, although providing an improved rectifying diode/rectifying gate on the semiconductor diamond layer, nevertheless increases the source and drain series resistance.

Other prior art technologies which are related to the utilization of diamond technologies such as Gildenblat "Second International Conference on the New Diamond Science and Technology", Washington, DC 1990 have shown that a metal-oxide-semiconductor transistor operation can be obtained by employing silicon dioxide as a gate electrode insulator. The structure was selectively grown, homoepitaxially on a diamond substrate followed by $SiO_2$ deposition for the gate oxide. The measured current-voltage characteristics demonstrated modulation of channel conductance as would be expected from a depletion-mode field-effect transistor. However, this behavior came with several impediments. The first impediment is that similar to the work of Shiomi et al, requiring single crystal material. Second, the interface between the silicon dioxide and the diamond is difficult to adequately obtain and control. As a result interface states are generated which adversely affect device performance and ultimate pinch-off voltage. Thirdly, the adhesion of silicon dioxide to diamond is a limiting parameter with these devices if they are to be designed for a hazardous environment. The coefficient of thermal expansion of silicon dioxide and diamond leads to a mismatch which may not withstand temperature cycling.

Other prior art diamond technology either utilize single crystal diamond structure or provide a substrate which is very difficult to synthesize such as the boron nitride crystals. Furthermore, recent developments in this area have resulted in electrical devices which have poor electrical characteristics such as insufficient breakdown voltage or require expensive and extremely critical geometry in order to provide an acceptable device.

SUMMARY OF THE INVENTION

Accordingly it is an object of the present invention to provide metal-insulator-semiconductor devices which utilize advantages of semiconductor diamond as a semiconducting material but which are able to be fabricated from deposited polycrystalline diamond thin films.

It is a further object of the present invention to provide a fully implanted structure employing a polycrystalline diamond thin film and incorporating a self-aligned process.

It is a further object of the present invention to provide a metal-insulator-semiconductor diode using a polycrystalline diamond thin film.

It is a further object of the present invention to provide a transistor structure fabricated from polycrystalline diamond thin film and having improved transistor electrical properties.

It is a further object of the present invention to provide for implementation of semiconductor diamond technology without requiring a single crystal diamond substrate.

DETAILED DESCRIPTION OF THE PREFERRED EMBODIMENTS

Figure 1A:
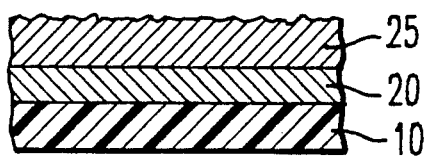
FIGS. 1a–1g illustrate the preparation stages for fabricating a metal-insulator-semiconductor structure according to the present invention.
Figure 1B:
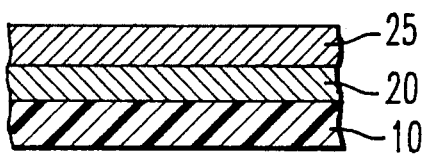
Figure 1C:
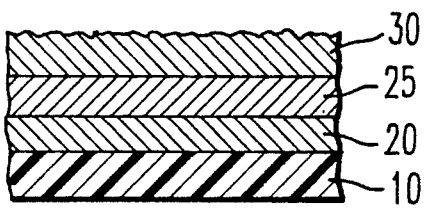

A more complete appreciation of the invention and many of the attendant advantages thereof will be readily obtained as the same becomes better understood by reference to the following detailed description when considered in connection with the accompanying drawings, wherein:

FIGS. 1a–1g show the steps in the fabrication of a polycrystalline diamond thin film semiconductor. A silicon substrate 10 has deposited thereon a film of insulating polycrystalline diamond which is at least 20 microns thick. The layer 20 is polished and any contaminants or remaining graphitic components due to mechanical damage are removed by chemical etching before a second diamond thin film 25 is deposited on the existing layer 20. This second diamond film 25 is a boron-doped p-type semiconductor transistor channel layer which is a "quasi-epitaxial" layer and exhibits improved properties when compared to a single layer grown on an alternate substrate. This layer 25 can be subsequently polished as shown in FIG. 1b and/or followed by a third deposition of an undoped insulating diamond layer 30.

Figure 1D:
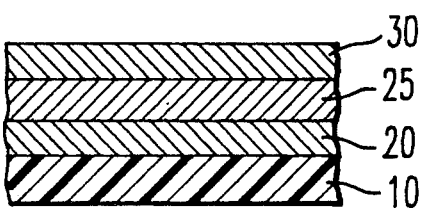

The polishing of the layer 20 and subsequently of the layer 25 can be accomplished by employing 0.1 micron diamond grit and a polishing device. Other appropriate methods may be used bearing in mind the 20 micron thickness of the layer 20 and the 1-2 micron doped channel layer thickness of the layer 25. Because of the small thickness of the layer 25 such a deposition can be sufficiently planar and thus no additional polishing is necessary. The polishing effectively planarizes the polycrystalline diamond surface as shown in FIG. 1d which yields more uniform diamond layers and therefore a more uniform electric field. It is especially critical to have a uniform electric field across the undoped insulating diamond layer.

The polycrystalline diamond films such as 20 and 25 were, for example, formed by the use of a microwave plasma chemical vapor deposition technique and these films were grown using $CH_4$, diluted in $H_2$ to 0.5% as a source gas with $B_2H_6$ as the dopant gas and at a total gas pressure of 31.5 Torr and with the substrate temperature of 800° C. The boron to carbon (B/C) ratio in the reaction gas was maintained at 4 ppm. Undoped diamond layers 30 were deposited for 15, 30, and 60 minutes in a second growth chamber not in the presence of boron. The diamond growth rate is about 0.2 microns per hour. The p-type doped film 25 can also be formed by ion implantation as will be discussed below. Any other method for the deposition of electronic device quality diamond can be used to form these layers.

In the next step a 0.1-0.2 micron-thick gate electrode is formed by, for example, an electron-beam evaporated, or other deposition method, aluminum, or other metal. Subsequently, the aluminum electrode as shown in FIG. 2 was formed by for example photolithography of patterns on the evaporated aluminum in order to provide a mask which was used to etch the unwanted aluminum.

Figure 2:
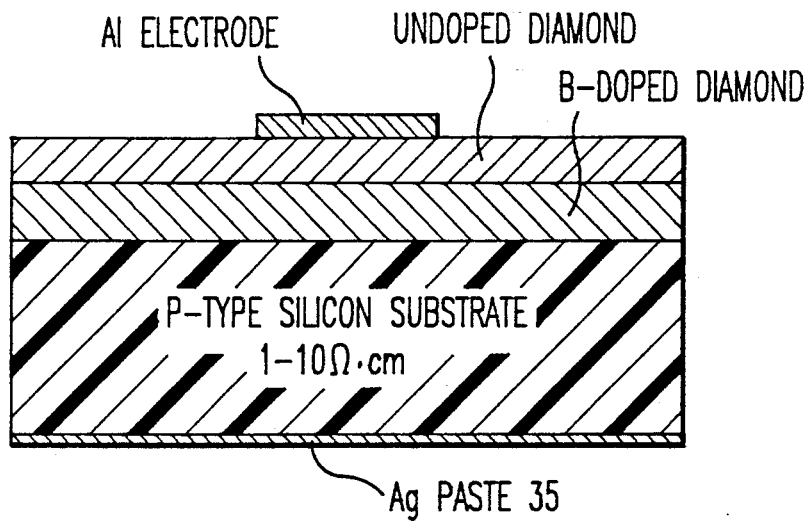
FIG. 2 illustrates a completed metal-insulator-semiconductor diode using the polycrystalline diamond thin films techniques of FIG. 1.
Figure 3:
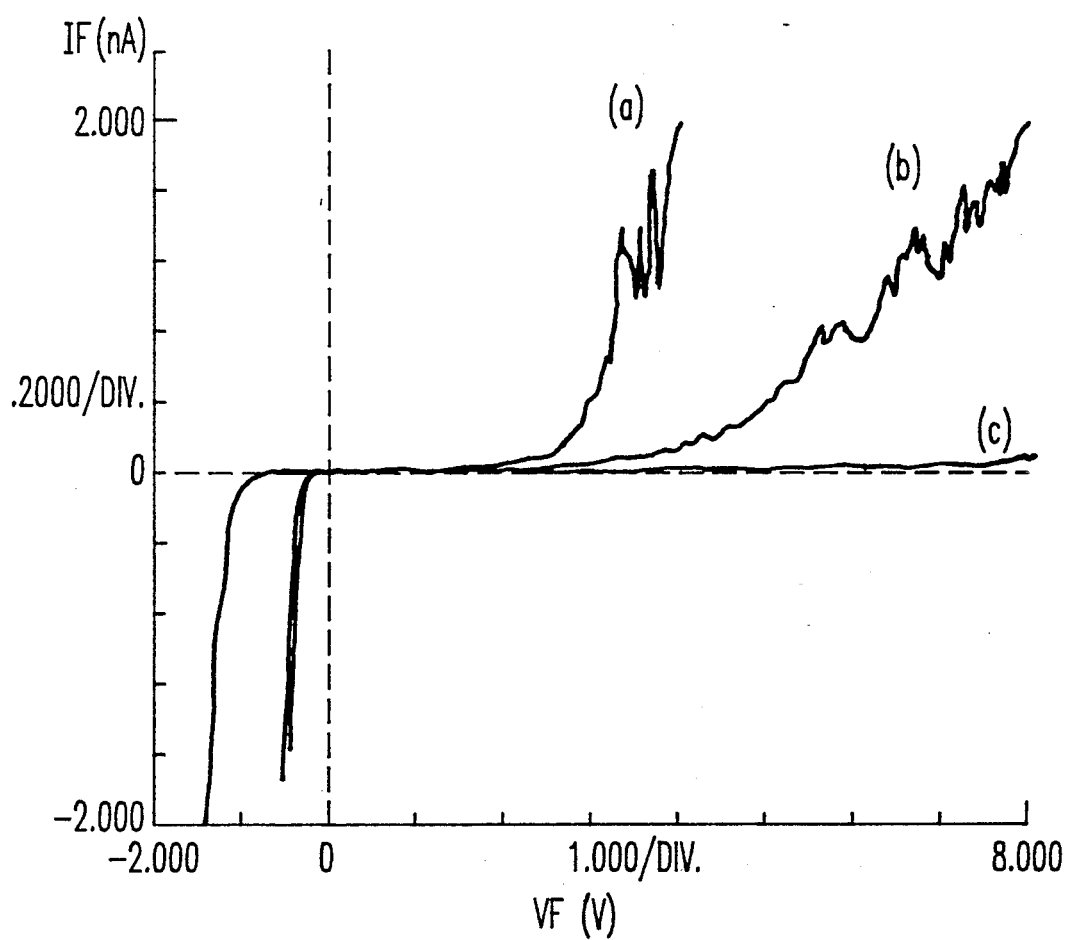
FIG. 3 illustrates the current-voltage characteristics for the MIS diode of FIG. 2.

The FIG. 3 shows the results of a current-voltage measurement of a metal-insulator-semiconductor structure of FIG. 2 with varying thicknesses of the undoped diamond film 30. The substrate consists of low-resistivity <1 Ω-cm boron-doped (111) -oriented silicon. Electrical contact to the substrate is made using silver paste. The curve (a) in FIG. 3 results from a structure of FIG. 2 without the undoped diamond layer 30 while the curve (b) shows an undoped diamond deposition time of 15 minutes and the curve (c) shows an undoped diamond deposition time of 60 minutes. It is to be noted that the turn on voltage and more importantly the reverse breakdown voltage of the structure increases for increased undoped layer thicknesses with the length of time of deposition being proportional to the thickness of the layer. That is, it can be seen that, for the graph (a) there was observed poor rectification when there was no undoped layer. However, with increased undoped diamond layer thickness, the reverse leakage current significantly decreased so that eventually good rectification and increased breakdown voltage were observed for the curve (c) of FIG. 3. These current-voltage characteristics are similar to those observed for the case of homoepitaxial diamond, i.e., a single crystal diamond substrate.

The improved rectifying characteristics for the aluminum contacts to the polycrystalline semiconductor diamond thin films are due to the introduction of the insulating undoped diamond layer 30 which significantly improved the reverse breakdown voltage yielding an enhanced rectifying contact.

This illustration of the improvement in the reverse breakdown voltage characteristics for the processed metal-insulator-semiconductor diode of FIG. 2 establishes the basis for other devices to be fabricated in accordance with the utilization of the undoped diamond layer.

One of the significant advantages of this structure and process is that any substrate material which is capable of supporting a large-grain continuous polycrystalline diamond deposition (PCD) can be used. In fact, the substrate can essentially be removed. Its purpose is to act as a base for the polycrystalline deposition.

Figure 4A:
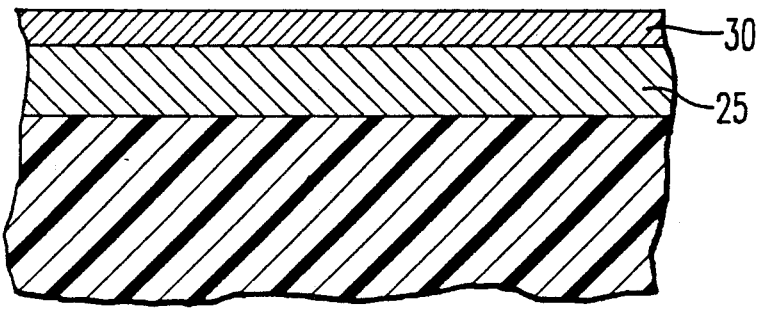
FIG. 4a and FIG. 4b illustrate the process for ion implantation of diamond devices according to the present invention.
Figure 4B:
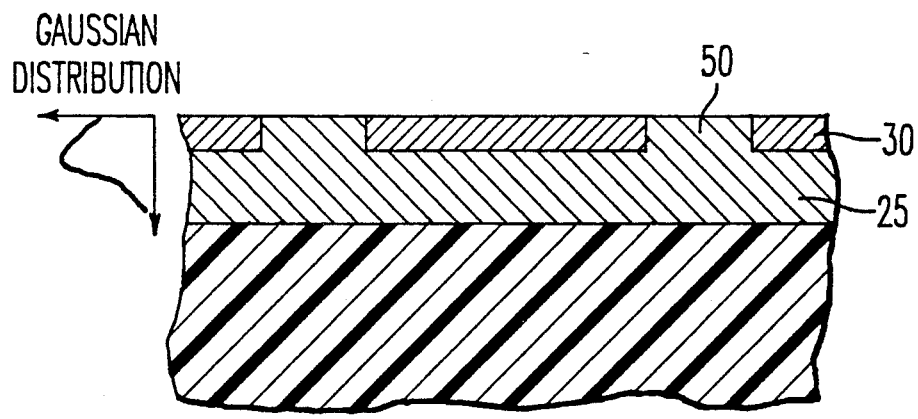

In a particular modification, the layer 25 can be formed by ion-implatation wherein the polycrystalline deposited layer 20 is between 20 and 30 microns and is polished as previously mentioned. The channel layer 25 is formed with a boron implant at high energy and low temperatures in order to preserve the insulating top layer and to form a p-type active layer. The necessity of multiple implants is a result of the narrowness of the Gaussian spread of implanted dopant atoms. By spreading out the channel depth, lower doping levels can be used to achieve the same channel conductivities. This configuration serves to reduce the electric field throughout the structure. Co-implantation using carbon is employed to create vacancies in the crystal lattice that can later be filled by B-atoms after annealing. One advantage of a fully-implanted structure device is that the insulating gate 30 is formed as an integral part of the device. Several ion implantation steps are utilized to form a buried channel which has undoped diamond between the channel and the surface of the device. FIG. 4a shows the buried boron-doped layer with FIG. 4b showing the construction of the buried boron-doped layer by way of ion implantation. The FIG. 4b also illustrates the formation of selected area ohmic contacts 50 which are also formed by ion implantation or surface modification.

The ion implantation takes place at liquid nitrogen temperatures and involves, in a first step, the co-implantation of the deepest portion of the buried layer 25 consisting of for example, carbon at 200 keV and having a dose of $2 \times 10^{15}/cm^2$. The carbon essentially acts as a lattice vacancy generator and creates spaces which can be occupied by the boron doping which takes place at 120 keV with a dose of $6 \times 10^{14}/cm^2$. Next, the remainder of the channel is co-implanted with carbon at an energy of 145 keV with a dose of $7 \times 10^{14}/cm^2$, and subsequently doubly boron-implanted at 90 keV with a dose of $4 \times 10^{14}/cm^2$ and 65 keV with a dose of $3.5 \times 10^{14}/cm^2$ to complete the doped channel region. These parameters can yield an effective channel carrier concentration of about $1 \times 10^{17}/cm^3$ at a depth of 1000 Å from the surface.

The structure is then annealed to remove implantation damage and activate the boron dopant. Due to the possibility of surface leakage currents, due to implantation damage extending to the surface, a subsequent deposition of an additional undoped insulating diamond layer 30 may also be necessary for higher performance devices.

Low-resistance ohmic contacts 50 to the buried channel layer 25 can be formed either by ion implantation or surface modification of layer 30. With the improvement in ion implantation into diamond the entire structure can be made using a series of deep implants to form the channel layer thus forming fully-implanted structure device. These ohmic contacts 50 have the purpose of connecting the electrode structure which will be metallized later with the buried doped layer 25. These layers can be formed at room temperature and involve doping with boron at 65 kev with a dose of $3 \times 10^{16}/cm^2$.

Other variations of this arrangement can involve the addition of the insulating layer of undoped diamond 30 subsequent to the ion implantation and alternate methods to selectively modify the surface layer 30 such as low-energy ion or electron bombardment or laser damage.

Figure 1E:
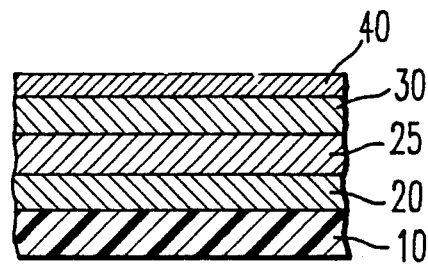
Figure 1F:
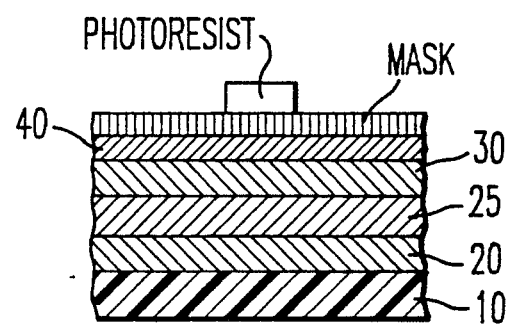
Figure 1G:
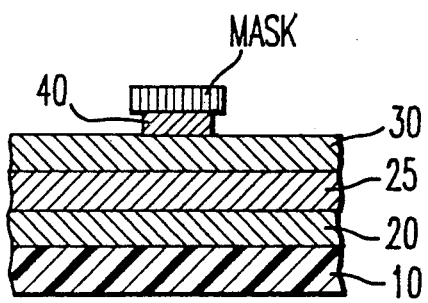

This ion implantation or surface modification can take place in an alignment type of structure which is formed by masking certain areas or it can be constructed as a self-aligned process as shown in FIGS. 1e-1g. The same self-aligning processing which is used in the formation of the diode of FIG. 2 can be utilized to create other devices or later steps in the other devices such as thin film transistors.

An alternate method to obtaining ohmic contacts to the buried channel is to selectively remove layer 30 in the regions 50 of FIG. 4b by use of plasma etching of diamond employing a suitable mask such as gold or chrome. Highly controllable electron-beam assisted etching of diamond has been reported by Kobashi et al.

Figure 5A:
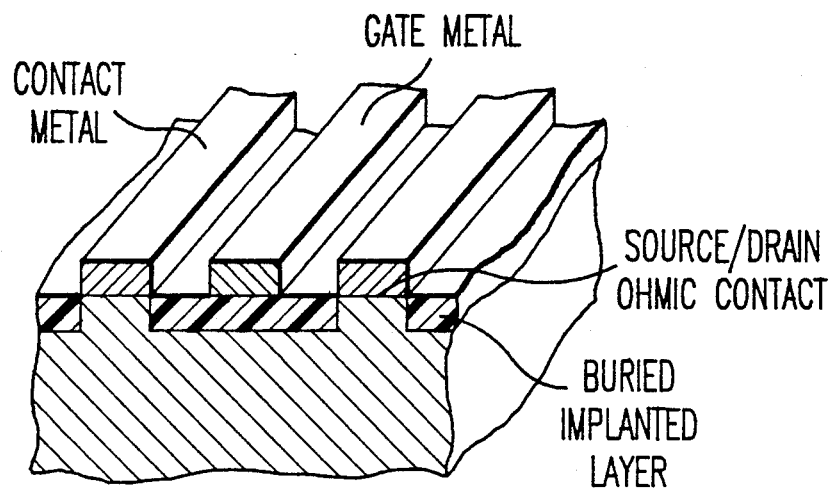
FIG. 5a and FIG. 5b illustrate mechanically aligned and self-aligned MISFET structures.
Figure 5B:
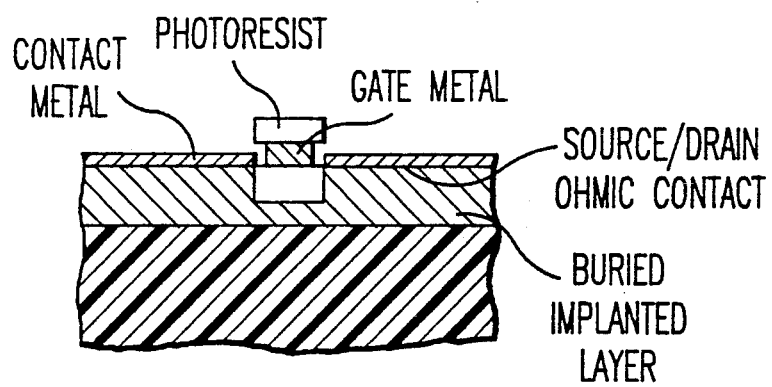

FIG. 5a shows an implantation of an MISFET structure wherein the buried implanted layer and the source/drain ohmic contacts are provided in a similar manner to FIG. 4b. The structure formed is that of a field effect transistor and the ion implantation which is necessary to accomplish the FIG. 5a is a masking structure which is not self-aligned and which comes about with mechanical alignment of a masking structure followed by the etching of holes in order to provide the areas which are to be implanted. The FIG. 5b illustrates a MISFET structure similar to FIG. 5a with the exception that FIG. 5b is formed as a result of a self-aligning procedure. This self-aligning procedure is an improvement over FIG. 5a because it can be formed without the need for mechanical alignment of a masking process and is illustrated in FIGS. 1e-1g. This occurs simply because everything outside of the area of the photoresist-patterned mask can be implanted, modified, or etched. In FIG. 1f, a metal electrode 40 is deposited onto the diamond surface layer 30. Next a selectively etchable material such as $SiO_2$ or amorphous silicon layer is deposited. The electrode is patterned photolithographically exposing the mask surface. The mask is etched to conform to the photoresist patterns. Next the metal electrode is over-etched to yield an undercut or "Tee" structure as in FIG. 1g. The Tee structure can have overhangs of less than 1 micron. Thus it can be seen that, for purposes of providing low-resistance source/drain ohmic contact, any ion implantation can simply be over the entire structure with the only area left open is the channel between the source and drain which is directly below the mask. The source and drain metallization can then be accomplished using the same masking step. This is self-aligning and aside from the ease of use and its accuracy it also provides for a reduced resistance between the source and the drain and smaller device geometries. This reduced resistance between the source and the drain is brought about by the fact that the distance between the source and drain can be smaller in a self-aligned process than in a mechanical alignment arrangement as illustrated in FIG. 5a. Effectively the resistance between the source and the drain is through the buried implanted layer and if a shorter distance is required to go from the source through the buried implanted layer to the drain then the resistance will be less. Obviously the layer that is directly between the source and the drain is an insulating layer. For the case of mechanical alignment, biases in excess of 2 microns are necessary to insure that the gate electrode does not overlap on either the source or drain electrodes. Thus in the mechanically aligned structure the distances between the source and the drain can not be be fabricated so that the source and drain are as close together as in the case of the self-aligned structure. After the source and drain modified ohmic regions and the buried implanted layer are formed then the contact metal structure is metallized to complete the structure. Again, etching of the diamond can also be employed and since most reactive-ion etching schemes can be anisotropic, the self-aligned structure can be preserved.

As indicated previously the surface polishing is important to reduce the roughness and it is essential in obtaining narrow gate line widths of 1 micron or less for useful devices. The surface planarization which occurs because of the polishing also makes a polycrystalline structure more uniform in terms of its electric field distribution across the undoped layer.

The ability to use a non-diamond substrate provides for large-areas for electronic devices, mass production, and thus an inexpensive route to commercialize on diamond devices. Perhaps more importantly is the possibility to create many combinations of semiconductors and device structures such as heterojunctions for radiation detection/emission, thermal sensing and pressure sensing. Simply employing insulating diamond layers as enhanced rectifying of insulating junctions for other device technologies hold great promise.

The first layer 20 after polishing and etching is used as a substrate for the subsequently formed device processing or the device structure is implanted directly into this layer 20.

It should also be noted that the fully-implanted structure can be used on single crystal diamond material as well. These devices providing useful features both as the disclosed polycrystalline structures as well as the advantage of higher carrier mobility as found in single crystal material/devices.

When heteroepiaxtial techniques become available, providing a sufficiently thick insulating diamond buffer layer is used, the same techniques as described above can apply.

The ability of the disclosed process to provide a device which does not require a single crystal diamond substrate is due to the bilayer structure afforded by the combination of the B-doped diamond layer of polycrystalline diamond 25 and the undoped diamond layer 30 which enables the construction of a MIS device having improved current-voltage characteristics to the point where excellent rectification and increased breakdown voltage are possible. Formation of such structure in self-aligning processes utilizes either in-situ doped channels and subsequent undoped surface layer deposition or fully implanted buried layers which are implanted through the insulating undoped diamond layer 30. An additional undoped layer can be added to the implanted structure to enhance performance. Surface modification is used to reduce the source-to-drain resistance.

Obviously, numerous modifications and variations of the present invention are possible in light of the above teachings, such as the use of vertical structure instead of the illustrated planar technology which would require a conducting substrate without the need for an insulating undoped polycrystalline buffer layer such as layer 20. It is therefore to be understood that within the scope of the appended claims, the invention may be practiced otherwise than as specifically described herein.

What is claimed as new and desired to be secured by Letters Patent of the United States is:

1. A semiconductor junction type diamond device, comprising:
   a conducting substrate
   a first polycrystalline diamond thin film layer formed on said substrate wherein said layer is boron-doped;
   a second polycrystalline diamond film formed on said first film layer wherein said second film is an undoped insulator film;
   an electrode metallized on the back of the substrate; and
   another electrode structure metallized on said second layer to form with said first, second and substrate layers a resulting semiconductor junction type device with excellent rectifying characteristics and large breakdown voltages wherein said resulting device is a vertical metal-insulator structure.

2. A semiconductor junction type diamond device, comprising:
   a substrate;
   a first insulating polycrystalline diamond film formed on said substrate;
   a second polycrystalline diamond thin-film formed on said first film and having a boron-doped portion serving as a channel layer;
   a third insulating undoped polycrystalline diamond film formed on said boron-doped portion of said second polycrystalline film;
   an electrode structure metallized on said third layer and a low-resistance ohmic contact in electrical contact with and between said electrode structure and said boron-doped portion of said second layer, said electrode, said first, said second and said third layers forming a resulting semiconductor junction type device with excellent rectifying characteristics and large breakdown voltage; and
   wherein said resulting semiconductor junction type device is a planar structure.

3. The junction device according to claim 1 wherein said boron-doped second thin film is an ion implanted film.

4. The device according to claim 2 wherein said resulting semiconductor junction type device is a MISFET and said device further includes etched, ion implanted or surface modified source and drain contacts formed in said third layer and source and drain electrodes formed on said respective source and drain contacts.

5. The device according to claim 1 wherein said resulting semiconductor junction type device is a diode.

6. The device according to claim 2 wherein said resulting semiconductor junction type device is a diode.

7. The device according to claim 5 wherein said diode is a Schottky diode.

8. The device according to claim 6 wherein said diode is a Schottky diode.

9. The device according to claim 2 wherein said first layer is greater than 20 microns and wherein said second layers between 1 and 2 microns.

10. The devices in any one of claims 1 or 2 wherein said first film is a polished film.

11. The devices in any one of claims 1 or 2 wherein said substrate is any material which can allow for the deposition of large-grain continuous polycrystalline diamond.

12. The device according to claim 2 wherein said substrate is silicon.

13. The device according to claims 1 or 2 wherein the substrate is removable.

14. The device according to claim 2, wherein said ohmic contact is a surface modified region of said third layer.

15. The device according to claim 2, wherein said ohmic contact is an ion implanted region of said third layer.

16. The device according to claim 2, wherein said ohmic contact is a chemically etched region of said third layer.

* * * * *